United States Patent
Yamamoto

(10) Patent No.: US 6,441,404 B1
(45) Date of Patent: *Aug. 27, 2002

(54) MULTICHIP MODULE

(75) Inventor: Kenji Yamamoto, Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/403,043

(22) PCT Filed: Apr. 27, 1998

(86) PCT No.: PCT/JP98/01945

§ 371 (c)(1),
(2), (4) Date: Jan. 14, 2000

(87) PCT Pub. No.: WO98/49728

PCT Pub. Date: May 11, 1998

(30) Foreign Application Priority Data

Apr. 28, 1997 (JP) ............................................. 9-110798

(51) Int. Cl.⁷ ...................... H01L 33/00; H01L 27/15; H01L 29/74
(52) U.S. Cl. .............................. 257/99; 257/82; 257/83; 257/84; 257/115
(58) Field of Search ......................... 257/99, 115, 918, 257/83, 84, 173, 82, 121, 124, 133; 313/498

(56) References Cited

U.S. PATENT DOCUMENTS 5,990,499 A * 11/1999 Kuhlmann et al. ........... 257/99
6,169,295 B1 * 1/2001 Koo ............................. 257/81

FOREIGN PATENT DOCUMENTS

| JP | 60-240171 |   | 11/1985 |
| JP | 402105472 A | * | 4/1990 |
| JP | 6-69413 |   | 3/1994 |
| JP | 406125116 A | * | 5/1994 |
| JP | 8-18003 |   | 1/1996 |
| JP | 411260985 A | * | 9/1999 |

* cited by examiner

Primary Examiner—Eddie Lee
Assistant Examiner—Joseph Nguyen
(74) Attorney, Agent, or Firm—Arent Fox Kintner Plotkin & Kahn

(57) ABSTRACT

A multichip module has a light-emitting device having an anode electrode or a cathode electrode thereof connected to a supplied voltage or a reference voltage, a control circuit, having a substrate of an opposite conductivity type to the substrate of the light-emitting device, for controlling the electric current that is passed through the light-emitting device, a lead frame including an island 4 on which both the light-emitting device and the control circuit are mounted, and a package for sealing the light-emitting device and the control circuit. Despite being compact, this multichip module allows a satisfactorily large amount of light to be emitted from the light-emitting device.

4 Claims, 5 Drawing Sheets

MULTICHIP MODULE

TECHNICAL FIELD

The present invention relates to a multichip module provided with a light-emitting device such as an LED (light-emitting diode) or LD (laser diode) and an integrated circuit and designed for use in an electronic appliance or the like that exchanges data by infrared communication such as a PC (personal computer), PDA (personal digital assistant), DSC (digital still camera), or DVC (digital video cassette recorder).

BACKGROUND ART

A conventional multichip module provided with an LED and an LSI (large-scale integration) will be described. In FIG. 7, at (a) is shown a schematic view of a conventional multichip module provided with an LED 12 and an LSI 13, and at (b) is shown an equivalent circuit diagram thereof The LED 12, when a voltage is applied thereto, emits near-visible light such as infrared rays.

The LSI 13 is a monolithic integrated circuit having a circuit formed only on one side of a wafer. In the circuit diagram shown at (b) in FIG. 7, the monolithic LSI 13 is represented by a frame of broken lines. Within the frame of broken lines, only an output transistor, among other components incorporated in the monolithic LSI 13, is shown. This output transistor is an NPN-type bipolar transistor having a high driving capacity, and is inserted between the LED 12 and a reference potential. Here, the monolithic LSI 13 serves to control the amount of light emitted from the LED 12 by controlling the current flowing through the LED 12.

A metal lead frame 19 is constituted of island portions 14a and 14b for bonding chips such as the LED 12 and lead terminal portions 16 for external connection. Here, as shown at (b) in FIG. 7, neither of the cathode and the anode of the LED 12 is connected to a reference potential or a supplied voltage, and therefore the potential of the substrate thereof cannot be made equal to the potential of the substrate of the monolithic LSI 13. Thus, the LED 12 cannot be mounted on the same island portion as the monolithic LSI 13, and this is the reason that, as shown at (a) in FIG. 7, they are mounted on separate island portions 14a and 14b.

The LED 12 and the monolithic LSI 13 are together sealed in a package 15 made of resin. In the circuit diagram shown at (b) in FIG. 7, reference numeral 17 represents a current limiting resistor that is either mounted externally via the lead terminal portions 16 of the lead frame or formed within the LSI 3.

When this multichip module 11 having the above-described structure is energized, the LED 12 emits light and simultaneously generates heat. This heat is first absorbed by the island portion 14a, which has a low heat resistance, and is then dissipated into air through the package 15.

In this multichip module 11 having the above-described structure, the monolithic LSI 13 is larger than the LED 12, and accordingly the island portion 14b for the monolithic LSI 13 is so formed as to be larger than the island portion 14a for the LED 12. Since the island portions 14a and 14b need to be formed within the package 15 having a limited size, it is inevitably impossible to secure a sufficiently large area for the island portion 14a for the LED 12.

As described above, the island portion 14a for the LED 12 first absorbs the heat of the LED 12 and then dissipates the heat into air through the package 15. However, the island portion 14a, which is thus smaller than is desired, cannot absorb sufficiently the heat of the LED 12, and accordingly the multichip module offers an unduly low package power (power dissipation capacity); that is, the LED 12 offers an unduly low heat capacity. This requires that the current flowing through the LED 12 be limited so as to restrict the amount of heat generated, and thus the amount of light emitted.

To achieve satisfactory dissipation of the heat of the LED 12, it is possible to form, for example, a heat dissipation fin on the island portion 14a. FIG. 8 is a schematic view of a multichip module as is realized by additionally forming heat dissipation fins 18a and 18b in the multichip module 11 described above. The heat dissipation fins 18a and 18b are formed integrally with the island portion 14a, with parts thereof protruding from the package 15. The heat dissipation fin 18a dissipates heat into air, and the heat dissipation fin 18b, which is so formed as to make contact with the printed circuit board (not shown) on which the multichip module 11 is mounted, dissipates heat through this printed circuit board.

Instead of providing heat dissipation fins 18a and 18b, it is also possible to make the package 15 itself larger so as to enlarge the island portion 14a for the LED 12 and thereby increase the heat capacity of the island portion 14a.

However, forming a heat dissipation fin 18a or 18b or enlarging the package 15 inevitably makes the multichip module as a whole larger. This imposes extra limitations on the above-mentioned printed circuit board, or hinders miniaturization of electric appliances in which the multichip module is incorporated.

DISCLOSURE OF THE INVENTION

An object of the present invention is to provide a compact multichip module that offers a higher package power and that allows a satisfactorily large amount of light to be emitted from a light-emitting device.

To achieve the above object, according to the present invention, a multichip module is provided with: a light-emitting device having an anode electrode or a cathode electrode thereof connected to a supplied voltage or a reference voltage; a control circuit, having a substrate of an opposite conductivity type to the substrate of the light-emitting device, for controlling the electric current that is passed through the light-emitting device; a lead frame including an island on which both the light-emitting device and the control circuit are mounted; and a package for sealing the light-emitting device and the control circuit. In this structure, the heat that the light-emitting device generates as it emits light is absorbed by the lead frame, and is then dissipated therefrom into air through the package.

BEST MODE FOR CARRYING OUT THE INVENTION

Figure 1:
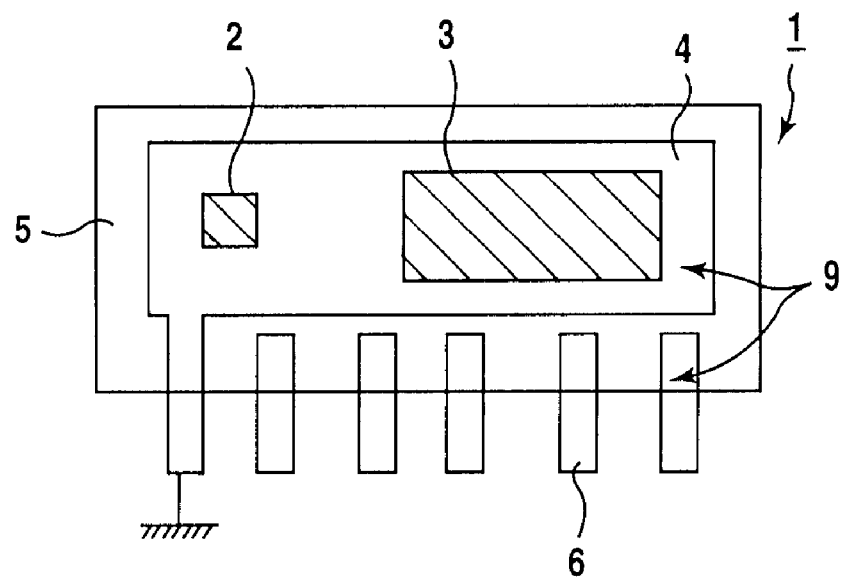
FIG. 1 is a schematic view of the multichip module of a first embodiment of the present invention.
Figure 2:
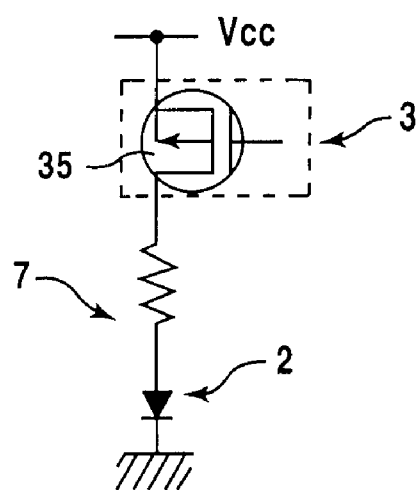
FIG. 2 is an equivalent circuit diagram thereof.

Hereinafter, embodiments of the present invention will be described with reference to the accompanying drawings. FIG. 1 is a schematic view of the multichip module, provided with an LED and an LSI, of a first embodiment of the present invention, and FIG. 2 is an equivalent circuit diagram thereof. The LED 2 is a light-emitting diode having an N-type substrate (a substrate of N-type conductivity, i.e. a substrate of an N-type semiconductor). The LED 2, when a voltage is applied thereto, emits near-visible light such as infrared rays.

The LSI 3 is a monolithic integrated circuit having a P-type substrate (a substrate of a P-type semiconductor) and having a circuit formed only on one side of a wafer. In the circuit diagram shown in FIG. 2, the monolithic LSI 3 is represented by a frame of broken lines. Within the frame of broken lines, only a P-channel MOS transistor serving as an output transistor, among other components incorporated in the monolithic LSI 3, is shown.

A metal lead frame 9 is constituted of an island portion 4 for mounting chips such as the LED 2 and lead terminal portions 6 for external connection. Here, as shown in FIG. 2, connecting the cathode of the LED 2 to a reference potential, using an N-type substrate for the LED 2, and using a P-type substrate for the monolithic LSI 3 make it possible to mount the LED 2 and the monolithic LSI 3 on the same island portion 4. This point will be described below with reference to the structure diagram shown in FIG. 3.

The LED 2 uses its N-type substrate as its cathode, and this N-type substrate is connected by way of the island portion 4 to ground. On the other hand, the LSI 3 is mounted on the same island portion 4, and its P-type substrate 30 is kept in contact with the island portion 4. In the P-type substrate 30, an N well 31 is formed, and, in this N well 31, a source 32 and a drain 33 are formed. Reference numeral 34 represents a gate electrode. Thus, the N well 31, the source 32, the drain 33, and the gate electrode 34 constitute a P-channel MOS transistor 35, of which the source 32 is, together with the N well 31, connected to a direct-current supplied voltage Vcc.

In the P-type substrate 30, many MOS transistors are formed in addition to the above-mentioned P-channel MOS transistor 35. Of those MOS transistors, P-channel MOS transistors are formed in other N wells formed in the P-type substrate 30, and N-channel MOS transistors are formed directly in the P-type substrate 30.

Figure 3:
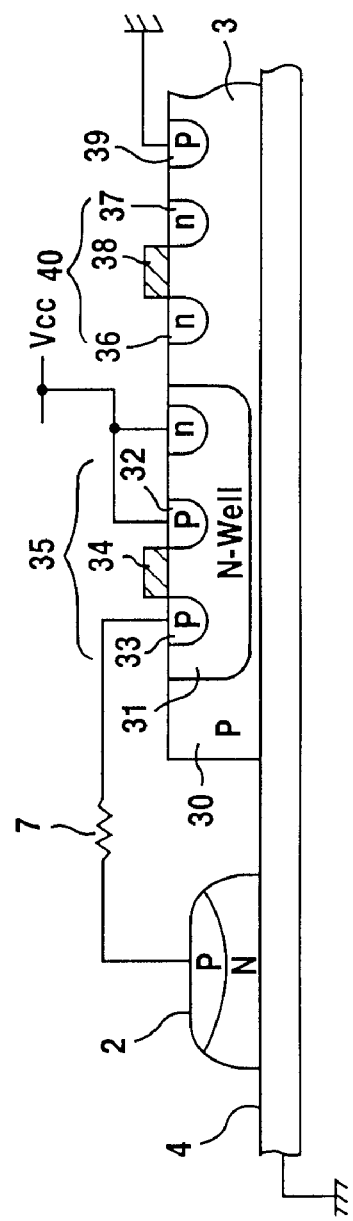
FIG. 3 is a structure diagram of a principal portion thereof.

For example, as shown in FIG. 3, in another part of the P-type substrate 30, an N-channel MOS transistor 40 is formed that has a source 36, a drain 37, and a gate electrode 38. In this case, the substrate 30 is customarily connected to ground by way of a P region 39. This means that it is allowed to keep the P-type substrate 30 in contact with the island portion 4, which is connected to ground. Therefore, it is possible to mount the LSI 3 and the LED 2 together on the same island portion 4.

The monolithic LSI 3 controls the current flowing through the LED 2, and thereby controls the amount of light emitted from the LED 2. It is to be noted that the output transistor may be a bipolar transistor as is used conventionally, as long as the relationship between the LED 2 and the monolithic LSI 3 in terms of the conductivity type of their substrates is kept the same as in the embodiment under discussion.

The LED 2 and the monolithic LSI 3 are sealed in a package 5 made of resin. In FIG. 2, reference numeral 7 represents a current limiting resistor that is mounted externally via the lead terminal portions 6.

Figure 7A:
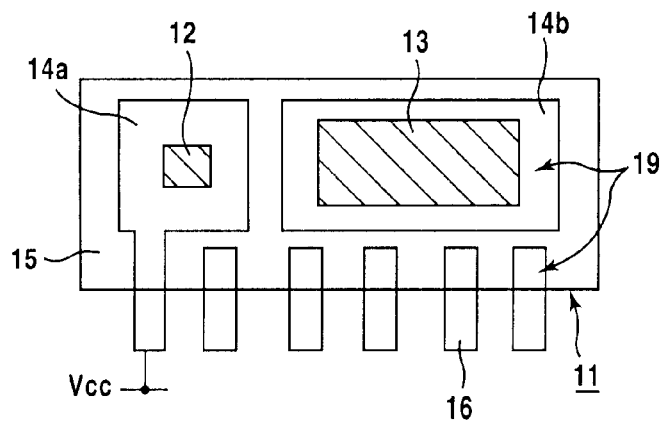
FIG. 7 shows a conventional multichip module, with a schematic view thereof shown at (a) and an equivalent circuit diagram thereof shown at (b).
Figure 7B:
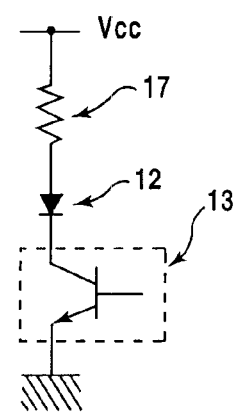
Figure 8:
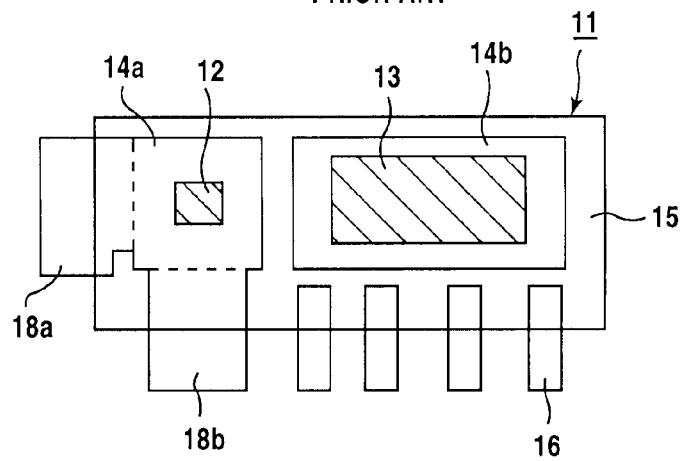
FIG. 8 is a schematic view of another conventional multichip module.

When this multichip module 1 having the above-described structure is energized, the LED 2 emits light and simultaneously generates heat. The generated heat is first absorbed by the island portion 4, which has a low heat resistance, and is then dissipated therefrom into air through the package 5. In this embodiment, both the LED 2 and the monolithic LSI 3 are mounted on the island portion 4. Accordingly, the island portion 4 is larger, and thus absorbs more heat, than the island portion 14*a* (see FIG. 7) of the conventional multichip module 11. As a result, it is possible to attain a higher package power.

This makes it possible to ease the limit on the current that is passed through the LED 2 and thereby increase the amount of light emitted therefrom. In addition, there is no need to adopt a special structure as by additionally providing a heat dissipation fin, and therefore it is possible to cope satisfactorily with miniaturization of electronic appliances in which the multichip module is incorporated. Moreover, it is possible to achieve satisfactory dissipation of not only the heat generated by the LED 2 but also the heat generated by the monolithic LSI 3, and therefore there is no need to limit the current that is passed through the monolithic LSI 3.

Figure 4:
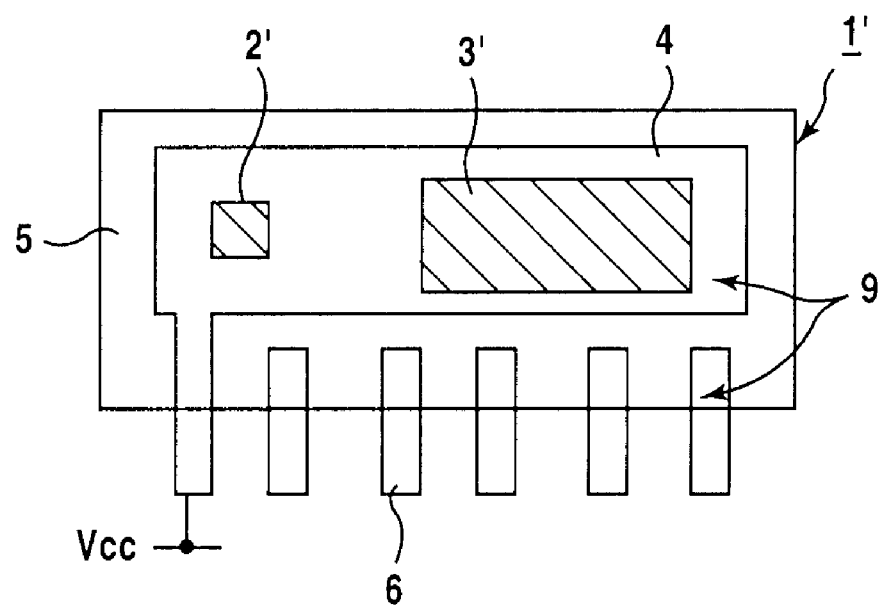
FIG. 4 is a schematic view of the multichip module of a second embodiment of the present invention.
Figure 5:
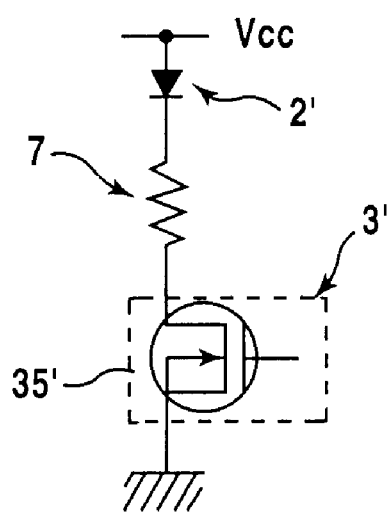
FIG. 5 is an equivalent circuit diagram thereof.
Figure 6:
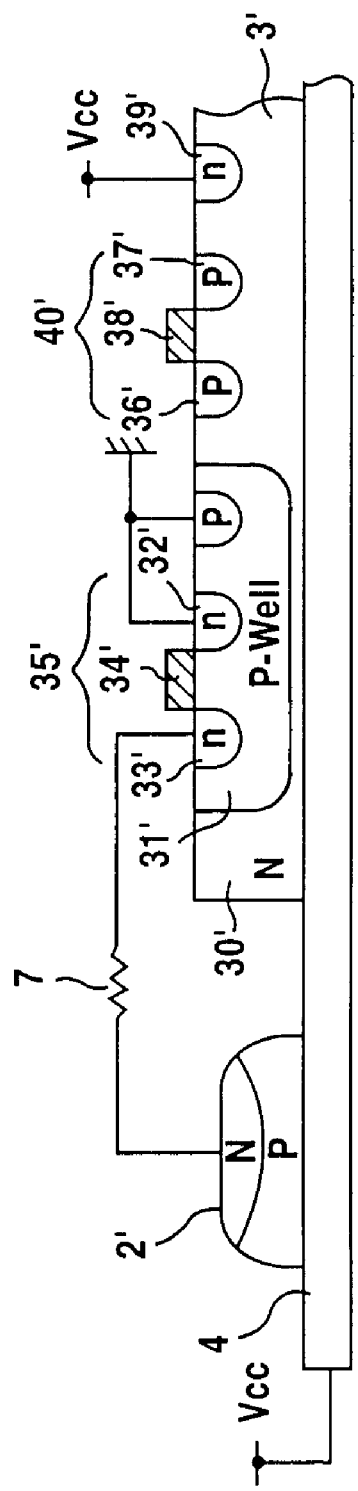
FIG. 6 is a structure diagram of a principal portion thereof.

In the first embodiment, the multichip module is provided with an LED 2 having an N-type substrate and a monolithic LSI 3 having a P-type substrate. However, it is also possible to achieve a similarly functioning structure by the use of an LED having a P-type substrate and a monolithic LSI having an N-type substrate. A multichip module having such a structure is shown in FIGS. 4 to 6 as a second embodiment of the present invention. FIG. 4 is a schematic view of this multichip module 1', FIG. 5 is an equivalent circuit diagram thereof, and FIG. 6 is a structure diagram of a principal portion thereof. Reference numeral 2' represents an LED having a P-type substrate, and reference numeral 3' represents a monolithic LSI having an N-type substrate. In this case, the transistor 35' is an N-channel MOS transistor.

In FIG. 6, the LED 2' has a P-type substrate as its anode, and this P-type substrate is connected by way of the island portion 4 to a direct-current supplied voltage Vcc. The LSI 3' has an N-type substrate 30', and this N-type substrate 30' is customarily connected to the direct-current supplied voltage Vcc by way of an n region 39'. Therefore, it is possible to mount the LSI 3', together with the LED 2', on the island portion 4, which is directly connected to the supplied voltage Vcc. Reference numeral 31' represents a P well, and reference numeral 40' represents a P-channel MOS transistor.

Industrial Applicability

As described above, according to the present invention, in a multichip module, an LED and a monolithic LSI are mounted on one continuous island portion of a lead frame, and thus the island portion can be given a maximum of area within a package. As a result, the heat generated is fully absorbed by the lead frame and is then dissipated into air through the package. This makes it possible to attain a significantly higher package power while keeping the multichip module compact, and thereby increase the amount of light emitted. Offering these advantages, the present invention is highly useful in a multichip module provided with a light-emitting device such as a light-emitting diode or laser diode and an integrated circuit and designed for use in an electronic appliance or the like that exchanges data by infrared communication such as a personal computer, personal digital assistant, digital still camera, or digital video cassette recorder.

What is claimed is:

1. A multichip module comprising:

a light-emitting device having a cathode electrode thereof connected to a reference voltage or an anode electrode thereof connected to a supplied voltage;

a control circuit, formed on a second semiconductor substrate having an opposite conductivity type to a first semiconductor substrate of the light-emitting device, for driving the light-emitting device through an output transistor so as to control an electric current that is passed through the light-emitting device;

a lead frame including an island on which both the first and second semiconductor substrates are mounted; and a package for sealing the light-emitting device and the control circuit, wherein the cathode electrode is connected to the reference voltage in which case the island is connected to the reference voltage, or the anode electrode is connected to the supplied voltage in which case the island is connected to the supplied voltage.

2. A multichip module as claimed in claim 1, wherein the control circuit is an LSI having a MOS transistor.

3. An infrared communication device incorporating a multichip module as claimed in claim 1.

4. An optical communication device incorporating a multichip module as claimed in claim 1.

* * * * *